(12) United States Patent
    Cobley

(10) Patent No.: US 9,344,041 B2
(45) Date of Patent: May 17, 2016

(54) POLAR AMPLIFICATION TRANSMITTER DISTORTION REDUCTION

(75) Inventor: Kevin Cobley, Cambourne (GB)

(73) Assignee: SnapTrack, Inc., San Diego, CA (US)

( * ) Notice: Subject to any disclaimer, the term of this patent is extended or adjusted under 35 U.S.C. 154(b) by 148 days.

(21) Appl. No.: 13/418,954

(22) Filed: Mar. 13, 2012

(65) Prior Publication Data

US 2012/0264380 A1    Oct. 18, 2012

(30) Foreign Application Priority Data

Mar. 14, 2011    (GB) .................................. 1104291.8

(51) Int. Cl.
| | |
|---|---|
| H04B 1/40 | (2015.01) |
| H03F 1/02 | (2006.01) |
| H03F 1/32 | (2006.01) |
| H03F 3/24 | (2006.01) |
| H04L 27/36 | (2006.01) |

(52) U.S. Cl.
    CPC ............... *H03F 1/0222* (2013.01); *H03F 1/32* (2013.01); *H03F 3/24* (2013.01); *H04L 27/361* (2013.01); *H04L 27/368* (2013.01); *H03F 2200/102* (2013.01)

(58) Field of Classification Search
    CPC ............ H04B 1/40; H04B 1/406; H04B 1/38; H04K 3/42
    USPC ....................................................... 455/73, 1
    See application file for complete search history.

(56) References Cited

U.S. PATENT DOCUMENTS

| | | | | |
|---|---|---|---|---|
| 5,606,580 | A | * | 2/1997 | Mourot ................. H04L 1/0007 370/465 |
| 5,668,326 | A | * | 9/1997 | Brown .................... G01P 5/248 73/861.27 |
| 5,712,883 | A | * | 1/1998 | Miller .............. G01R 31/31922 327/153 |
| 6,108,347 | A | * | 8/2000 | Holmquist ........... H04L 12/403 370/442 |
| 6,112,059 | A | | 8/2000 | Schwent et al. |

(Continued)

FOREIGN PATENT DOCUMENTS

EP            1672783 A1 *  6/2006

OTHER PUBLICATIONS

Sylvan, K., "GB Application No. GB1104291.8 Search Report Jul. 12, 2011", , Publisher: UK IPO, Published in: GB.

*Primary Examiner* — Hai V Nguyen

(57) ABSTRACT

A method of optimizing a transmitter, the transmitter including a polar amplification stage including a main signal path and a magnitude signal path, a receiver being located with the transmitter, the method comprising: generating an amplified signal for transmission at the output of the amplifier; tuning the receiver to a frequency to reject the intended transmit signal of the transmitter; determining a characteristic of a signal detected in the receiver representing an indication of distortion in the transmitted signal; and adjusting a setting of the transmitter in dependence on the determined characteristic.

18 Claims, 8 Drawing Sheets

(56) References Cited

U.S. PATENT DOCUMENTS

| | | | | |
|---|---|---|---|---|
| 6,321,075 B1* | 11/2001 | Butterfield | H03F 3/24 | 455/110 |
| 6,324,230 B1* | 11/2001 | Graham | H03G 3/3052 | 375/345 |
| 6,353,604 B2* | 3/2002 | Grimwood | | 370/335 |
| 6,563,807 B1* | 5/2003 | Kim | H04W 36/12 | 370/310 |
| 6,625,197 B1* | 9/2003 | Lundby | H04B 1/7117 | 370/208 |
| 6,643,530 B2* | 11/2003 | Diab | A61B 5/14551 | 600/323 |
| 6,717,980 B1* | 4/2004 | Rishi | H04B 1/525 | 375/219 |
| RE38,523 E* | 6/2004 | Ozluturk | H04B 1/70753 | 370/342 |
| 6,753,802 B1* | 6/2004 | Heydlauff | F41G 7/2253 | 342/13 |
| 6,757,255 B1* | 6/2004 | Aoki | H04L 1/187 | 370/229 |
| 6,791,964 B1* | 9/2004 | Hwang | H04B 1/7085 | 370/335 |
| 6,819,685 B1* | 11/2004 | Abouchakra | H04J 3/0632 | 370/310 |
| 6,829,629 B1* | 12/2004 | Magesacher | H03H 17/0671 | 708/313 |
| 6,889,151 B2* | 5/2005 | Freitag | G01D 3/022 | 702/106 |
| 6,937,617 B2* | 8/2005 | Rakib | H03M 13/256 | 348/E7.07 |
| 6,985,549 B1* | 1/2006 | Biracree | H04L 7/0004 | 375/355 |
| 7,263,135 B2 | 8/2007 | Takabayashi et al. | | |
| 7,308,017 B2* | 12/2007 | Jiang | H04B 1/7095 | 375/140 |
| 7,313,181 B2* | 12/2007 | Balamurugan | H04L 25/03038 | 375/232 |
| 7,321,617 B2* | 1/2008 | Garlett | H04B 17/101 | 375/224 |
| 7,372,917 B2 | 5/2008 | Jensen | | |
| 7,391,251 B1* | 6/2008 | Zhang | H03K 5/159 | 327/261 |
| 7,453,927 B2* | 11/2008 | Vepsalainen et al. | | 375/219 |
| 7,480,344 B2 | 1/2009 | Zolfaghari et al. | | |
| 7,496,063 B2 | 2/2009 | Toki et al. | | |
| 7,612,652 B2* | 11/2009 | Stewart | G06K 19/0705 | 340/10.1 |
| 7,729,238 B2* | 6/2010 | Shin | H04B 1/7183 | 370/210 |
| 7,808,956 B2* | 10/2010 | Petrie | H04W 52/225 | 370/318 |
| 7,856,048 B1* | 12/2010 | Smaini | H04B 1/40 | 330/2 |
| 7,936,812 B2* | 5/2011 | Hollis | H03K 3/356113 | 375/233 |
| 7,991,363 B2* | 8/2011 | Greene | H03H 7/40 | 455/125 |
| 8,060,027 B2* | 11/2011 | Muhammad | H03C 5/00 | 455/106 |
| 8,073,090 B2* | 12/2011 | Zhang | H04L 25/14 | 370/509 |
| 8,094,040 B1* | 1/2012 | Cornett | G08G 1/087 | 340/902 |
| 8,208,067 B1* | 6/2012 | Singh | G11B 27/034 | 345/473 |
| 8,223,891 B2* | 7/2012 | Kent | H04L 5/0007 | 375/326 |
| 8,249,536 B2* | 8/2012 | Jung | H04B 1/525 | 455/222 |
| 8,284,824 B1* | 10/2012 | Smaini et al. | | 375/221 |
| 8,335,230 B2* | 12/2012 | Saigo | H04L 5/0032 | 370/252 |
| 8,432,234 B2* | 4/2013 | Manssen | H03H 7/40 | 333/17.3 |
| 8,483,342 B2* | 7/2013 | Wu | H03H 17/0664 | 375/355 |
| 8,559,488 B1* | 10/2013 | Smaini et al. | | 375/221 |
| 8,576,736 B1* | 11/2013 | Sigg | H04B 1/7075 | 370/252 |
| 8,604,840 B2* | 12/2013 | Ahmadi | H03L 7/0891 | 327/107 |
| 8,634,341 B1* | 1/2014 | Vleugels | G06F 5/16 | 370/324 |
| 8,743,843 B2* | 6/2014 | Laroia | H04W 40/244 | 370/310 |
| 8,787,433 B2* | 7/2014 | Chaudhuri | H04B 1/406 | 370/395.5 |
| 8,837,435 B2* | 9/2014 | Singh | H04W 74/0816 | 370/335 |
| 8,842,581 B2* | 9/2014 | Hottinen | H04B 7/2615 | 370/278 |
| 8,989,097 B2* | 3/2015 | Wang | | 370/210 |
| 9,001,875 B1* | 4/2015 | Smaini et al. | | 375/221 |
| 9,030,498 B2* | 5/2015 | Galor | G06F 3/017 | 345/158 |
| 9,071,341 B2* | 6/2015 | Neff | H04B 1/7073 | |
| 9,083,440 B2* | 7/2015 | Bellot et al. | | |
| 9,088,504 B2* | 7/2015 | Yang | H04L 41/16 | |
| 2002/0009065 A1* | 1/2002 | Molko | H04B 7/2656 | 370/337 |
| 2002/0097341 A1* | 7/2002 | Patel | H04N 5/211 | 348/614 |
| 2002/0101907 A1* | 8/2002 | Dent | H03F 3/24 | 375/132 |
| 2002/0107969 A1* | 8/2002 | Waldvogel | H04L 12/1881 | 709/231 |
| 2003/0016637 A1* | 1/2003 | Khayrallah | H04B 7/0615 | 370/329 |
| 2003/0078006 A1* | 4/2003 | Mahany | G06F 1/163 | 455/63.1 |
| 2003/0102960 A1* | 6/2003 | Beigel | G06K 7/0008 | 340/10.1 |
| 2003/0103557 A1* | 6/2003 | Dolwin | H04B 1/7113 | 375/150 |
| 2003/0134427 A1* | 7/2003 | Roller | G01N 21/3504 | 436/171 |
| 2003/0141936 A1* | 7/2003 | Staszewski | H03L 7/0991 | 331/16 |
| 2003/0174641 A1* | 9/2003 | Rahman | H03D 3/008 | 370/206 |
| 2004/0095957 A1* | 5/2004 | Zhao | H04B 1/70754 | 370/464 |
| 2004/0106380 A1* | 6/2004 | Vassiliou | H04B 17/20 | 455/73 |
| 2004/0110461 A1* | 6/2004 | Giancola | H04B 1/7115 | 455/1 |
| 2004/0218699 A1* | 11/2004 | Carsello | H04L 7/042 | 375/343 |
| 2004/0219884 A1* | 11/2004 | Mo | H04B 1/30 | 455/67.11 |
| 2004/0248516 A1* | 12/2004 | Demir | H03F 1/3294 | 455/63.1 |
| 2005/0044463 A1* | 2/2005 | Frisch | G01R 31/31709 | 714/738 |
| 2005/0069026 A1* | 3/2005 | Vepsalainen | H03F 1/0222 | 375/219 |
| 2005/0246432 A1* | 11/2005 | Iijima | H04N 7/17309 | 709/223 |
| 2006/0007828 A1* | 1/2006 | Kadowaki | G01N 21/9506 | 369/53.12 |
| 2006/0009162 A1* | 1/2006 | Tan | H01Q 3/267 | 455/67.11 |
| 2006/0104242 A1* | 5/2006 | Kim | H04L 1/1812 | 370/329 |
| 2006/0121861 A1* | 6/2006 | Diepstraten | H04L 7/04 | 455/130 |
| 2006/0164275 A1* | 7/2006 | Fuchs | H03M 1/0626 | 341/144 |
| 2007/0052417 A1* | 3/2007 | Zhang | G01R 33/56341 | 324/309 |
| 2007/0197256 A1* | 8/2007 | Lu | H04B 1/4706 | 455/552.1 |
| 2008/0165059 A1* | 7/2008 | Karr | G01S 13/765 | 342/378 |

(56) References Cited

U.S. PATENT DOCUMENTS

| | | | |
|---|---|---|---|
| 2008/0303443 A1* | 12/2008 | Tran | G01R 3/0254 315/1 |
| 2009/0196163 A1* | 8/2009 | Du | H04L 5/0046 370/204 |
| 2009/0232234 A1* | 9/2009 | Du | H04B 7/2621 375/260 |
| 2009/0323642 A1* | 12/2009 | Tanno | H04B 1/7075 370/336 |
| 2010/0233971 A1* | 9/2010 | Vassiliou et al. | 455/73 |
| 2011/0235459 A1* | 9/2011 | Ware | G11C 7/04 365/233.11 |
| 2012/0039329 A1* | 2/2012 | Sun | H04B 1/1027 370/345 |
| 2012/0087230 A1* | 4/2012 | Guo | H01Q 3/267 370/208 |
| 2012/0106539 A1* | 5/2012 | Ferraiolo | G06F 13/4204 370/351 |
| 2012/0140957 A1* | 6/2012 | Poulsen | H04M 1/72527 381/120 |
| 2012/0250433 A1* | 10/2012 | Jeon | G11C 8/18 365/193 |
| 2013/0039207 A1* | 2/2013 | Vadasz | H04L 12/5601 370/252 |
| 2013/0101299 A1* | 4/2013 | Bellot | H04L 5/0039 398/139 |
| 2013/0176401 A1* | 7/2013 | Monari | H04N 5/2252 348/47 |
| 2013/0243219 A1* | 9/2013 | Zeng | H04L 1/0006 381/77 |
| 2014/0044009 A1* | 2/2014 | Piesinger | H04W 56/001 370/254 |
| 2014/0049418 A1* | 2/2014 | Feigin | G01S 7/2923 342/22 |
| 2014/0202314 A1* | 7/2014 | Billen | G10H 1/0008 84/609 |
| 2014/0204981 A1* | 7/2014 | Suntken | G01S 7/032 375/140 |
| 2014/0315499 A1* | 10/2014 | Olesen | H04B 17/00 455/73 |
| 2015/0200706 A1* | 7/2015 | Bottazzi | G01S 7/40 375/140 |
| 2015/0280899 A1* | 10/2015 | Vanden Bossche | H04B 17/20 375/362 |
| 2015/0295665 A1* | 10/2015 | Ma | H04L 27/2691 370/484 |
| 2015/0332339 A1* | 11/2015 | Das | G06Q 30/0275 705/14.66 |

* cited by examiner

POLAR AMPLIFICATION TRANSMITTER DISTORTION REDUCTION

CROSS-REFERENCE TO RELATED APPLICATIONS

Patent application GB1104291.8, filed Mar. 14, 2011, is incorporated herein by reference.

FIELD OF THE INVENTION

The present invention relates to a transmitter incorporating a polar amplification stage, and preferably but not exclusively to an amplification stage in which a signal to be amplified is provided to an input of an amplifier, and a supply voltage for the amplifier is generated in dependence on the envelope of a signal to be amplified.

DESCRIPTION OF RELATED ART

Polar transmitters are well-known in the art, and comprise an arrangement in which separate magnitude and main signal paths are utilized in order to amplify a signal for transmission. Such polar amplification stages are known to be used in RF (radio frequency) applications. A mobile communication system RF implementation may use such polar amplification stages.

Known polar transmitters techniques include envelope tracking (ET) techniques and envelope elimination and restoration (EER) devices. In an envelope tracking amplification stage a modulated power supply is generated for an amplifier in dependence on the envelope (magnitude) of the input signal to be amplified by the amplifier, and the input signal to be amplified is provided as the input to the amplifier.

It is an objective in such amplification stages to minimize the distortion in the transmitted signal. It is known that one cause of distortion is a result of the total delay suffered by the main signal (in a main signal path) and the total delay suffered by the magnitude signal (in a magnitude signal path) not being equal to each other. In order to meet system specification requirements, it is necessary to align the signals in the main signal path and the magnitude signal path to ensure that any timing misalignment between those signals falls within a permitted range. Any misalignment of the timing of the signals in the paths results in distortion of the transmitted signal, and can reduce transmitter efficiency.

In order to minimize the distortion caused by timing misalignment, it has been proposed in the prior art to match the delays in the signal and amplitude paths. Accurately matching the delays is difficult, and can require access to difficult to measure parameters to make direct delay estimation. Various techniques are known in the art for making estimations of the timing misalignment of the two paths in a factory calibration process, and subsequent adjustment of the delay in one or other path, so as to allow the relative delay to be adjusted. Delay can be measured by instrumenting the transmitter, but this is time consuming and inconvenient in production, and is invasive. Spectral estimation on a spectrum analyser is an example of this, but it can take a long time to capture adequate information to trim the delay accurately.

U.S. Pat. No. 7,480,344 discloses a technique in which an additional receiver is provided to demodulate a signal generated by the transmitter. This requires significant additional overhead in processing, and invasive measurement of the transmitter. The non-idealities of the measurement lead to an inevitable uncertainty in delay time. The technique also only has access to in-band distortion information.

U.S. Pat. No. 7,372,917 discloses a technique which requires demodulation and estimation of a received signal. It also requires the receiver to be tuned to an adjacent channel. In this arrangement the receiver is susceptible to interference from the main transmitted signal due to its finite rejection, causing a distortion in the measurement.

Distortion in the transmitted signal of a polar transmitter can also be caused by factors other than timing misalignment in the respective paths. For example, distortion in the transmitter may also be caused by gain errors in the envelope signal path.

It is an aim of the invention to provide a polar transmitter in which distortion in a transmitted signal is reduced.

It is also an aim of the invention to provide a technique for reducing the distortion in a polar transmitter during manufacture, in factory calibration.

It is a further aim of the invention to provide a technique for reducing the distortion in a polar transmitter during normal operation of the transmitter.

SUMMARY OF THE INVENTION

In one aspect the invention provides a method of optimising a transmitter, the transmitter including a polar amplification stage including a main signal path and a magnitude signal path, a receiver being located with the transmitter, the method comprising: generating an amplified signal for transmission at the output of the amplifier; tuning the receiver to a frequency to reject the intended transmit signal of the transmitter; determining a characteristic of a signal detected in the receiver representing an indication of distortion in the transmitted signal; and adjusting a setting of the transmitter in dependence on the determined characteristic.

The step of determining a characteristic of a signal detected in the receiver may comprise generating a quality of service indicator for the signal detected in the receiver, and the step of adjusting the setting of the transmitter comprises adjusting said setting in order to improve the generated quality of service indicator.

The method may further comprise generating a calibration signal for transmission by the transmitter, wherein the signal detected in the receiver comprises interference from the transmitter.

The method may further comprise adjusting a setting of the transmitter over a plurality of values, and determining a characteristic of a signal detected in the receiver for each value; determining the value which optimises performance, and selecting this value as the setting for the transmitter.

The method may further comprise generating a signal for transmission by the transmitter, wherein the signal detected in the receiver comprises an intended received signal together with interference from the transmitter.

The method may further comprise iteratively adjusting a setting of the transmitter over a plurality of values and determining a characteristic of a signal detected in the receiver for each value; averaging the iterative results; determining the value which optimises performance, and selecting this value as the setting for the transmitter The step of generating a quality of service indicator may comprise generating one of a received signal strength indicator; a signal-to-noise plus interference ratio; or a quality of service parameter dependent upon a signal-to-noise plus interference ratio.

The step of adjusting a setting in the transmitter may comprise adjusting one or more of a delay in the main signal path, or a delay in the magnitude signal path.

The transmitter circuit may further include a shaping function for generating a supply voltage in dependence on the magnitude of the signal to be amplified, the step of adjusting a setting in the transmitter comprising adjusting a setting of the shaping function.

In another aspect the invention provides an apparatus comprising a transmitter including a polar amplification stage including a main signal path from a transmitter input to an amplifier input and a magnitude signal path from the transmitter input to the amplifier supply, the apparatus further comprising a receiver adapted to reject the intended transmit signal of the transmitter, and including means for determining a characteristic of a signal detected in the receiver representing an indication of distortion in the transmitted signal, and a controller for adjusting a setting of the transmitter in dependence on the determined characteristic of the received signal.

The controller may be adapted to adjust the setting of the transmitter in order to reduce the distortion in the transmitted signal.

The receiver may be adapted to generate a quality of service indicator for the signal detected in the receiver, and the controller is adapted to adjust the setting of the transmitter order to improve the quality of service indicator.

The apparatus may further comprise a signal generator for generating a calibration signal for transmission by the transmitter, wherein the receiver is adapted to detect distortion from the transmitter.

The controller may be adapted to adjust the setting of the transmitter for a plurality values, and the controller is further adapted to determine a characteristic of a signal detected in the receiver for each value; the controller being adapted to determine the value which optimises performance, and to select this value as the setting for the transmitter.

The transmitter may be adapted to generate a signal for transmission, wherein the controller is adapted to detect a signal comprising a received signal and interference arising from distortion of the transmitter.

The controller may be adapted to iteratively adjust a setting of the transmitter over a plurality of values and determine a characteristic of a signal detected in the receiver for each value; average the iterative results; determine the value which optimises performance, and select this value as the setting for the transmitter.

Generating a quality of service indicator may comprise generating one of a received signal strength indicator; a signal-to-noise plus interference ratio; or a quality of service parameter dependent upon a signal-to-noise plus interference ratio.

Adjusting a setting in the transmitter may comprise adjusting one or more of a delay in the main signal path, or a delay in the magnitude signal path.

The transmitter circuit may further include a shaping function for generating a supply voltage in dependence on the magnitude of the signal to be amplified, the step of adjusting a setting in the transmitter comprising adjusting a setting of the shaping function.

A transceiver may including an apparatus as defined. The amplifier may be a radio frequency, RF, amplifier, and the input path is an RF signal path.

The polar amplification stage may be an envelope tracking stage comprising an amplifier arranged to receive an input signal to be amplified and a power supply voltage tracking the envelope of the input signal to be amplified.

BRIEF DESCRIPTION OF THE FIGURES

The invention is now described by way of example with reference to the accompanying drawings in which:

FIG. 4($b$) illustrates a modification to the transceiver of FIG. 1 in accordance with a second arrangement of the second embodiment of the invention;

DESCRIPTION OF PREFERRED EMBODIMENTS

Figure 1:
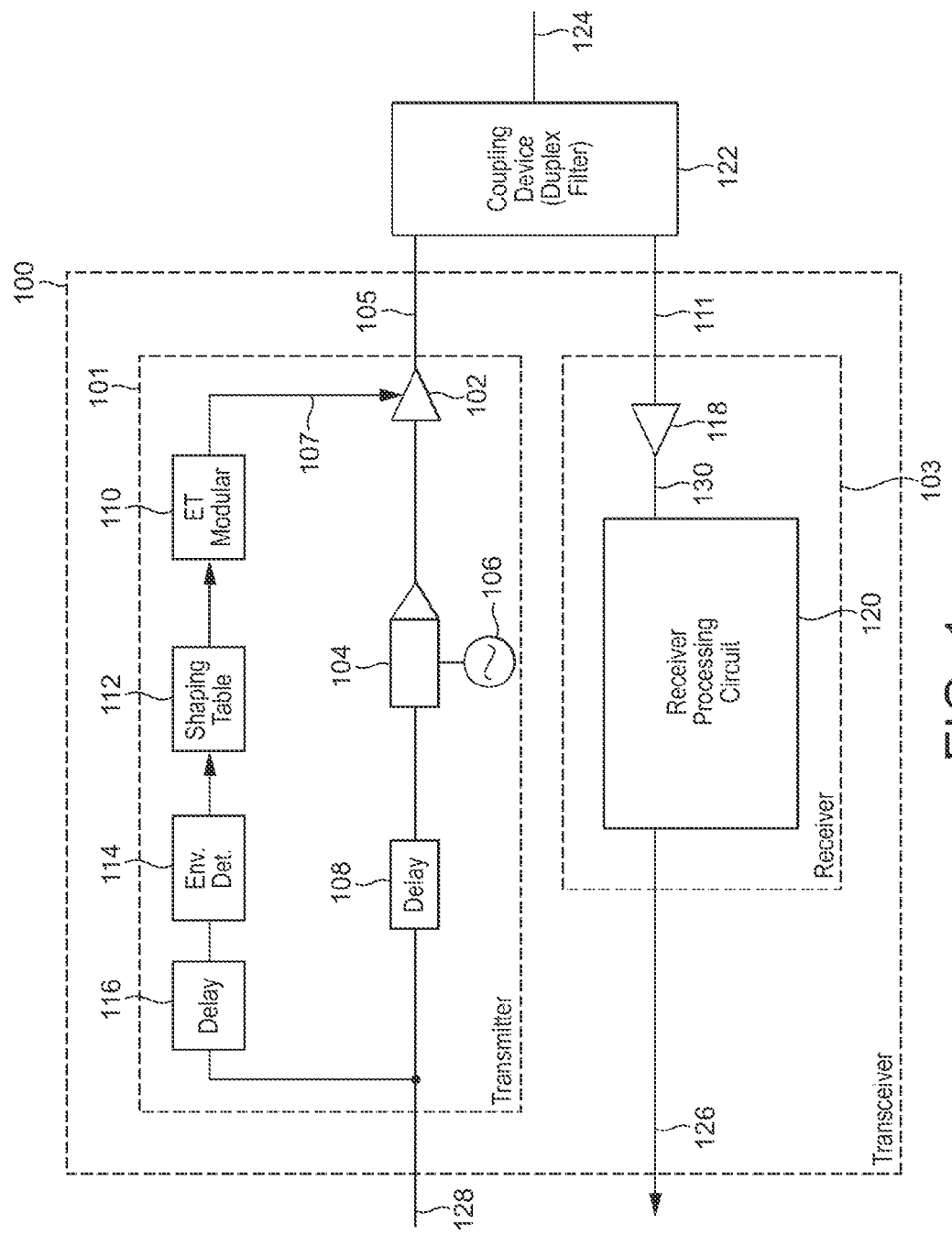
FIG. 1 illustrates a transceiver including an amplification stage utilising an envelope tracking power supply in accordance with an exemplary implementation of embodiments of the invention.

The invention, and its embodiments, is applicable in general to polar transmitters. In the following description the invention, and its embodiments, is described with specific reference to the example of a transmitter incorporating an envelope tracking (ET) polar modulation technique. However this is for the purposes of illustration and to aid in an understanding of the invention, and the invention is not limited to such a specific technique. The skilled person will appreciate that the invention may also be applied in other polar transmitter technologies including, for example, envelope elimination and restoration technologies. One skilled in the art will appreciate that the invention and its embodiments may be utilized in a broader range of polar transmitters than is set forth here.

The invention, and its embodiment, are further described herein with reference to an application in a mobile communications system, and moreover an application in a handset or mobile device of a mobile communications system. The invention is not limited in its applicability to implementation in a mobile communication system handset, and moreover is not limited generally in its applicability to mobile communication systems. One skilled in the art will appreciate that the invention and its embodiments may be utilised in a broader range of implementations than is set forth here.

In the following description, where an element of one Figure corresponds to an element of another Figure, like reference numerals are used to denote the correspondence. Aspects of different described embodiments may be combined. The presentation of a combination of features in an embodiment does not represent a limitation that the combination of features is necessarily essential to the embodiment, not exclude the possibility that elements of other embodiments may be combined with one of more elements of that embodiment.

With reference to FIG. 1 there is illustrated an exemplary transceiver 100 of a mobile communications system in accordance with which embodiments and arrangements of embodiments of the invention are described. The transceiver 100 generally comprises a transmitter 101 and a receiver 103. One skilled in the art will appreciate that only the elements of the transceiver necessary for an understanding of the embodiments and arrangements of embodiments of the invention are illustrated and described, and additional functionality is required to fully implement a transceiver, which functionality falls outside the scope of the present invention.

The exemplary transmitter 101 comprises a power amplifier 102 for amplifying an input signal to be transmitted. An input signal is provided on line 128 as an input to an optional variable delay block 108. The output of the variable delay block 108 provides an input to a signal modulator 104, which additionally receives a carrier signal from a local oscillator 106. The modulated signal to be transmitted is provided by the signal modulator 104 as an input to the power amplifier 102, which generates an amplified version of the modulated input signal at its output on line 105.

The exemplary transmitter 101 additionally includes an optional variable delay block 116 arranged to receive the input signal on line 128. An envelope detector 114 is arranged to receive the delayed input signal from the delay block 116 and to generate a signal representing the envelope of the signal to be transmitted. The thus generated envelope signal is provided as an input to a shaping function, such as a shaping table, 112. The output of the shaping function provides a voltage to an envelope tracking modulator 110, which provides a modulated supply voltage to the power amplifier on line 107.

The transmitter 101 includes an RF input path, defined by the path the input signal on line 128 traverses to the input of the power amplifier 102. The transmitter 101 includes an envelope path, defined by the path from the input signal on line 128 to the supply voltage input to the power amplifier 102 on line 107.

The variable delay blocks 116 and 108 in the envelope and RF input paths are optionally provided in order to adjust the relative delays between the signals in the envelope path and the RF input path in order to optimize system performance. In embodiments, only one of the two delay blocks may be provided, or both delay blocks may be provided.

The input to the shaping table 112 is typically a digital signal, and in a typical implementation the shaping table generates a digital signal at its output which is converted into an analogue signal and then filtered (such operations being well-known in the art, and not illustrated in FIG. 1). The shaping table 112 implements a non-linear mapping function between its input and its output to provide a shaped input to the envelope tracking modulator 110. The envelope tracking modulator 110 provides a power supply voltage on line 107 which tracks the envelope of the signal to be amplified in order to provide efficient operation of the amplifier 102.

The transceiver 100 further comprises a coupling device 122 which couples the output of the power amplifier 102 on line 105 to front end processing circuitry (not shown) via signal line 124, for example a transmit antenna for radio transmission of the amplified input signal. The coupling device 122 additionally couples a signal received by the front end processing circuitry on line 124, for example received on a receive antenna, to the receiver 103. The coupling device is a duplex filter, which as known in the art provides low attenuation from line 105 to line 124, and high finite attenuation from line 105 to line 111.

The receiver 103 comprises a pre-amplifier 118 for amplifying the signal received at the front end processing circuitry and provided by the coupling device 122 on line 111. The pre-amplified received signal is then delivered to a receiver processing circuit 120, the receiver processing circuit 120 being configured to process the received signal on line 130 and deliver a processed received signal on line 126, as known in the art.

In accordance with the invention, the transceiver 100 is adapted to optimize the performance of the transmitter 101 in dependence on a characteristic of a signal detected in the receiver 103. More particularly, in dependence on a characteristic of a signal detected in the receiver, an adjustment signal is generated for adjusting a setting in the transmitter.

In the described embodiments, in order to generate an adjustment signal a measurement is performed in the receiver to detect an error which causes a distortion in the transmitted signal. The adjustment adjusts one or more settings in the transmitter in order to reduce and preferably minimise the detected error in the receiver. The distortion in the transmitted signal influences the signal detected in the receiver, and the setting(s) in the transmitter is adjusted in dependence on that influence, in order to reduce and preferably minimise the influence.

In general, the embodiments described herein provide an adjustment signal based on a minimisation of the transmitted power from the communications system's transmitter channel in the communication system's receiver channel.

In the described embodiments, an arrangement is described, as per FIG. 1, in which a transceiver is provided including a transmitter and receiver. The invention is not limited to such an arrangement, however. Whilst the invention may be advantageously utilized in such a transceiver, the invention also applies to arrangements were an auxiliary receiver is provided with the transmitter for the purpose of providing the receiver functionality as described hereinbelow. In general, the invention applies to an arrangement where a receiver is located with the transmitter, whether as part of a transceiver or otherwise.

In a first described embodiment, an adjustment signal is generated in dependence on a characteristic of a signal detected in the receiver as part of a factory calibration process.

Figure 2:
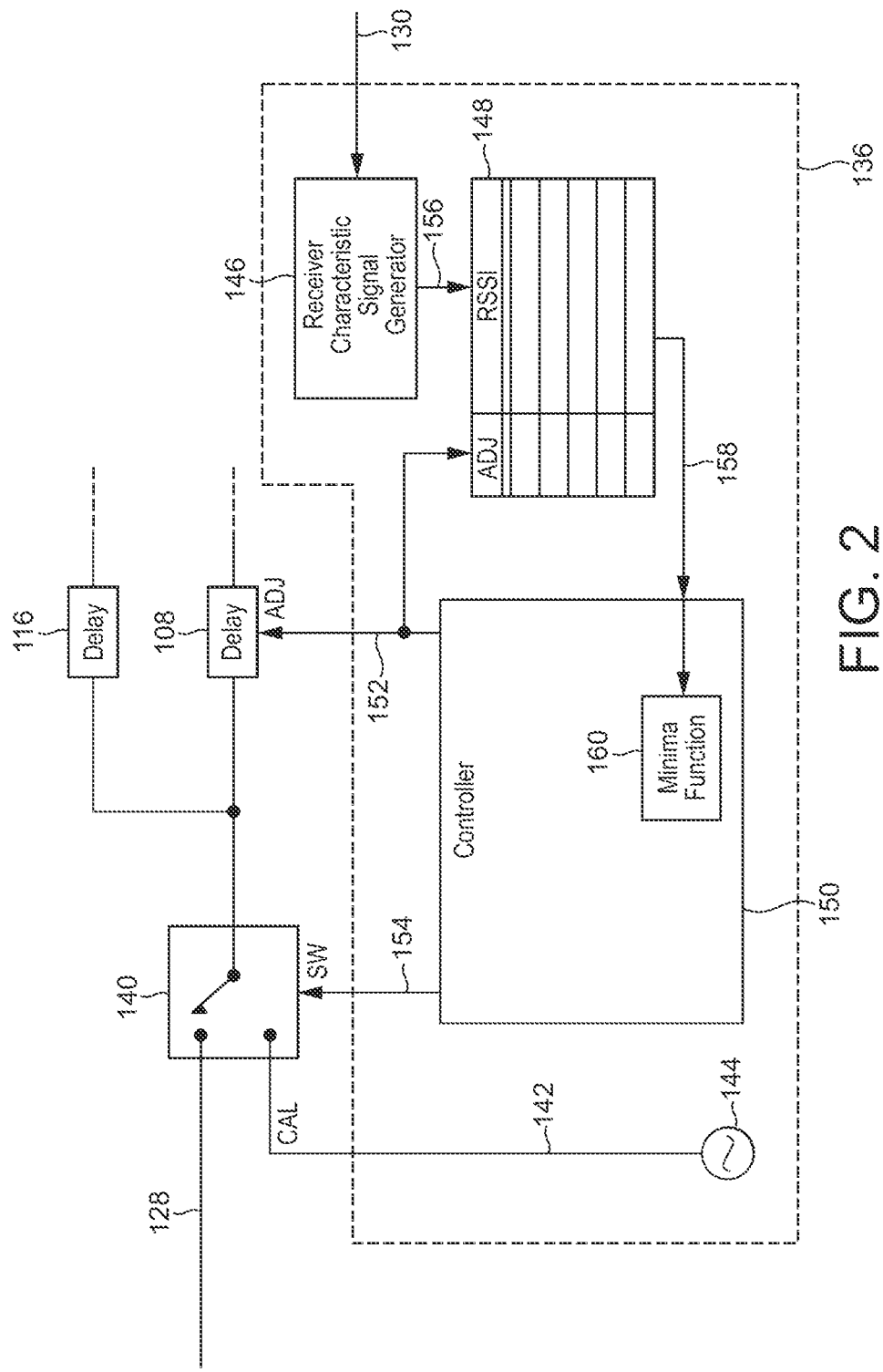
FIG. 2 illustrates a modification to the transceiver of FIG. 1 in accordance with a first embodiment of the invention.

In accordance with the first embodiment of the invention with reference to FIG. 2, a measurement and calibration block 136 is provided for the transceiver 100. The measurement and calibration block 136 includes a receiver characteristic signal generator 146, a buffer memory 148, a signal generator 144, and a controller 150. The transmitter is further adapted to include a switch 140.

The measurement and calibration block 136 receives the received signal on line 130, and generates an adjustment signal ADJ on line 152. The switch 140 is provided to selectively connect either the input signal on line 128 or a calibration signal CAL on line 142 (generated by the signal generator 144) to the delay block 108. The switch 140 is controlled by a switch signal SW from the controller 150 on line 154.

The receiver characteristic signal generator 146 is arranged to receive the signal on line 130 and generate a signal indicative of a characteristic of the signal detected in the receiver on line 156, which is delivered to the memory buffer 148. Preferably the receiver characteristic signal generator 146 is a functional block of the receiver, and does not require the provision of extra circuitry. The receiver characteristic signal generator may therefore be understood as being shown in the distinct measurement and calibration block 136 for illustration purposes, but may actually form part of the receiver.

The controller is arranged to generate the adjustment signal ADJ on line 152, and receive data for the memory buffer 148 as described further below. The memory buffer additionally receives the adjustment signal ADJ on line 152.

The receiver characteristic signal generator generates a signal representing a characteristic of a signal detected in the receiver. In preferred embodiments, the characteristic is a quality of service indicator for the signal detected in the receiver.

In a preferred arrangement of the first embodiment, the receiver characteristic signal generator is a received signal strength indicator (RSSI) block. As known in the art of mobile communication system, an RSSI block generates an RSSI signal, and the quality of service indicator generated is thus an RSSI signal. The implementation of an RSSI block or function, and its operation for generating an RSSI signal indicative of the quality of service of the received signal, will be familiar to one skilled in the art. Thus RSSI values are provided on line 156 to the memory buffer 148.

In accordance with the first embodiment of the invention, in a calibration operation during manufacture, the signal generator 144 of the measurement and calibration block 136 is configured to generate a calibration signal for transmission by the transmitter 101. The switch 140 is controlled to connect the calibration signal CAL on line 142 as the input to the delay block 108. The transmitter 101 is controlled to transmit at full power and maximum bandwidth with normal modulation.

In a factory calibration mode of operation, the receiver 103 is configured to receive at a frequency away from the transmitter frequency, at a frequency which has adequate rejection of the transmitter frequency itself. As such the receiver 103 cannot directly receive the transmitted signal. In one exemplary arrangement the receiver may be arranged to reject all frequencies of the transmit band of the transmitter. In another exemplary arrangement, however, the receiver may be arranged to reject the frequencies at which the actual transmit signal is present, rather than the whole transmit band.

The receiver 103 is enabled to process received signals in the normal way. However no actual received signal is present in the receiver on the signal line 124 from the front-end circuitry, as in a factory calibration process no signals intended for receipt are received, and the receiver 103, as noted in the preceding paragraph, is configured by frequency constraints not to receive the signal transmitted by the transmitter of the transceiver.

Thus any signal detected in the receiver 103 is attributable to interference from the transmitter, specifically caused by noise and distortion associated with the transmitted signal, and is present in the receiver 103 as a result of the finite path attenuation between the transmitter 101 and the receiver 103.

In accordance with normal operation of the receiver, the RSSI block provides an indication of the quality of service of the signal detected in the receiver 103 on signal line 156, and thus provides an indication of the interference as a result of the transmitter. The RSSI block is preferably the RSSI block provided for normal operation in the receiver 103, and therefore does not require any adaptation to the receiver 103.

The adjustment signal ADJ on line 152 is generated in order to adjust a setting of the transmitter to reduce distortion in the transmitted signal. The distortion in the transmitted signal contributes to the interference in the receiver. One of various settings of the transmitter may be adjusted, as discussed below. For the purposes of further illustrating the operation of the first embodiment, an example is discussed in which the setting of the delay in the delay block 108 is adjusted by the adjustment signal ADJ. Thus, as illustrated in the example arrangement of FIG. 2, the adjustment signal ADJ on line 152 is connected to the delay block 108, to provide a delay control signal for the delay block 108.

The adjustment signal on line 152 is adjusted by the controller 152 to have different values. For each value of the adjustment signal, an RSSI value is generated and stored in the memory buffer 148. The memory buffer 148 receives the RSSI signal on line 156, and the associated adjustment signal on line 152, and stores such pairs of values. As the input signal to the transmitter signal is unchanged across adjustment values, as it is provided by the signal generator 144, there is no requirement to capture the input signal to the transmitter. Thus the memory buffer 148 stores a table of determined RSSI values and the associated adjustment values, in this example arrangement the associated delay adjustment value applied to delay block 108, in a table.

At the end of the application of the appropriate number of adjustment values, the controller 150 determines the adjustment value, in this example the delay value, of the adjustment signal which generated the RSSI value having the lowest value. This delay value is then selected as the delay to be applied as the adjustment signal in the transmitter in normal operation. Thus the delay of the delay block 108 is set by the controller 150 for normal operation following the calibration phase.

As shown in FIG. 2, the controller 150 includes a minima calculation block 260 for determining the minimum RSSI value, which block receives the RSSI values on line 158 from the memory buffer 148. Alternatively any technique employing a minima search may be used in the block 160 in order to select the minima value. Once the minima is determined, the controller may retrieve the associated adjustment (delay) value from the memory buffer 148, and then apply that adjustment value on line 152 in normal operation.

Alternatively, an iterative technique may be utilized to minimize the RSSI by making successive adjustments to the adjustment signal, as one skilled in the art will appreciate.

Various other techniques may be implemented in order to determine the delay value providing the RSSI value minima, as will be apparent to one skilled in the art. Another alternative would be to use a Newton-Raphson type algorithm, i.e. use the slope of the change in the detected signal level in the receiver to choose the next step.

In accordance with the described first embodiment, the adjustment signal for the transmitter is thus generated using any appropriate optimization algorithm to minimize the RSSI value. The minimum RSSI value corresponds to the minimum distortion due to delay. In an envelope tracking amplification stage, or any polar transmitter, the level of distortion has a well-defined minima monotonically increasing away from the minimum, and as such an accurate estimation can be achieved with a simple iterative technique, in a small time with no external measurement equipment.

The described first embodiment provides a technique in which the adjustment signal can be generated based on only the measurement of a simple RSSI, without the need to tune the receiver to a special channel or any requirement to perform any special decoding of the transmitted signal. The RSSI gives a simple indicator of how to generate the adjustment signal to achieve the optimum reduction in distortion in the transmitter. The adjustment signal determined is the optimum adjustment for the transceiver, since it minimizes the distortion detected in the receiver.

The use of the RSSI signal in the first embodiment is only illustrative, and although advantageous the invention and its embodiments are not limited to the use of the RSSI signal. In general a characteristic of the signal detected in the receiver is determined, preferably a quality of service characteristic.

In this illustrative first embodiment, the adjustment signal gives an indicator of the optimum delay between the amplitude and envelope paths. This optimizes the alignment of the paths rather than perfectly matching the delays in the paths.

Because of group delay dispersion in the transmitter paths, the accurate DC delay is not necessarily the optimum value for receive band leakage, and therefore the optimization of relative delay is the preferred goal.

Figure 3:
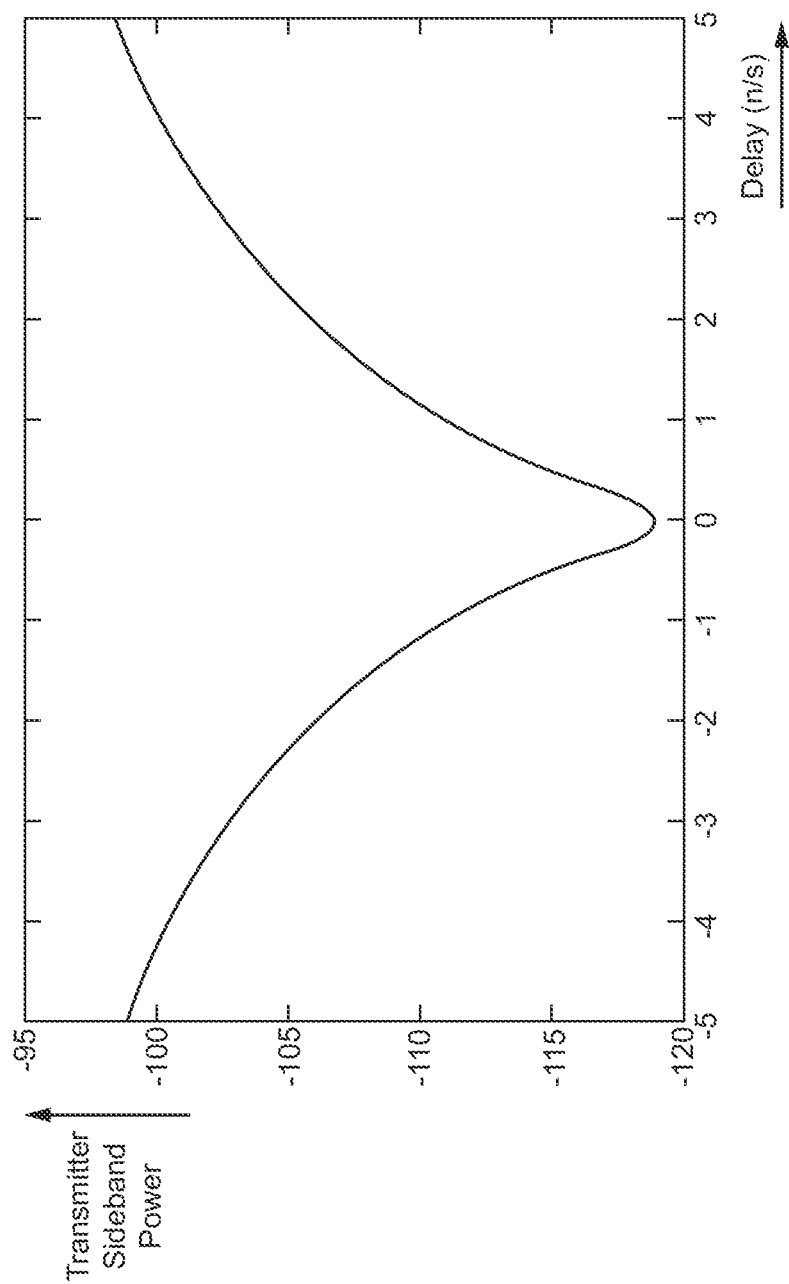
FIG. 3 illustrates a the effect of distortion in the transmitter as a result of misalignment in the transmitters signal and envelope paths.

The graph of FIG. 3 illustrates a plot of transmitter sideband power versus delay, and shows the effect of any delay between the signals in the RF input path and the envelope path. As can be seen, where there is no relative delay (delay=0), the sideband power is minimized. As the relative delay increases in either direction, the transmitter sideband power increases.

In the illustrated first embodiment, the adjustment signal is used to control the delay in the delay block in the RF input path. The invention, and any embodiment of the invention, is not limited to this use of the adjustment signal. In general the adjustment signal may be used to adjust any setting of the transmitter. For example, the adjustment signal may alternatively or additionally be used to vary the delay in the envelope path (by control of delay block 116). A further example, discussed below, is to use the adjustment signal to vary the settings of the shaping table 112. Other examples are also set out below.

Figure 4A:
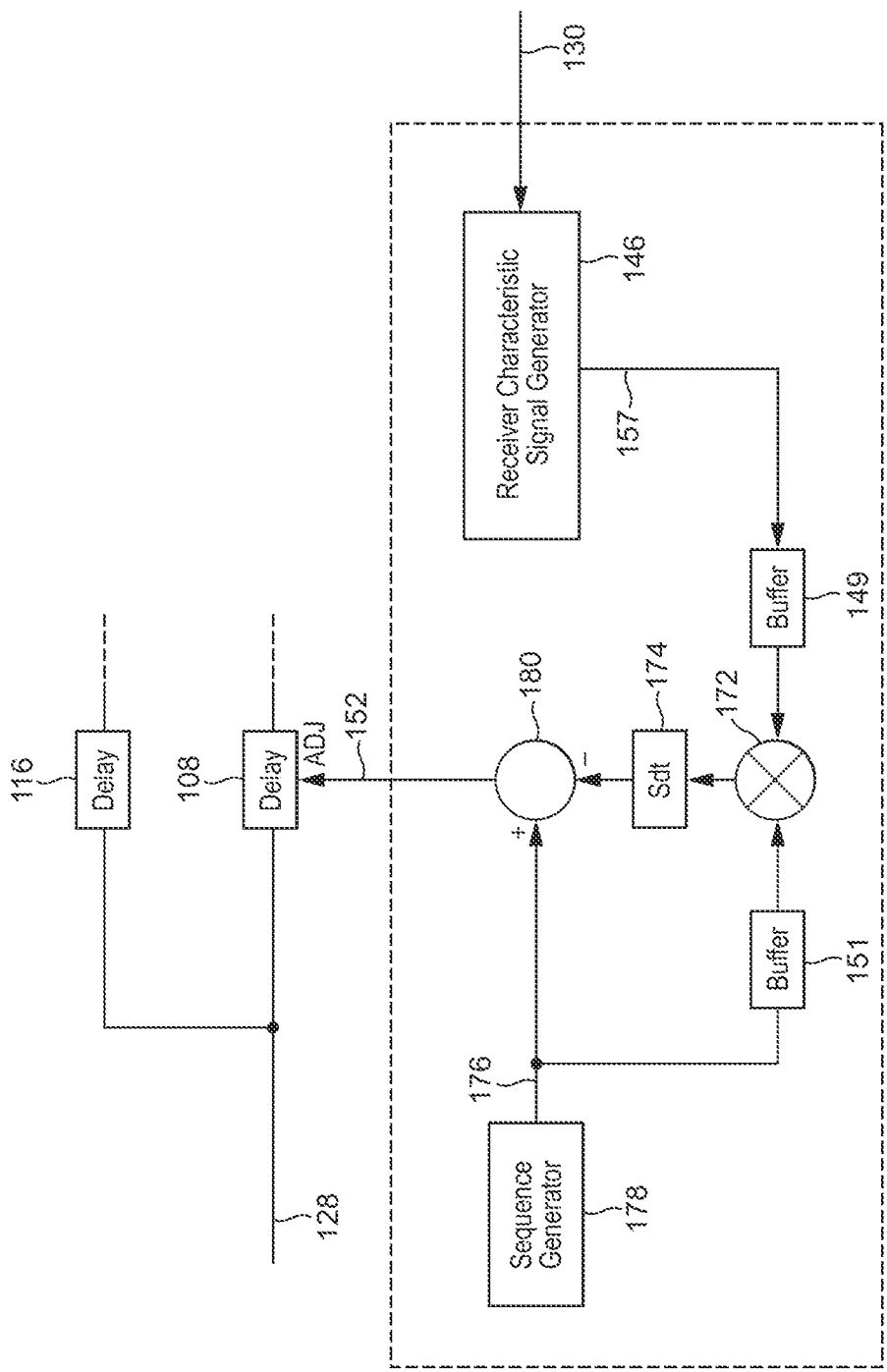
FIG. 4($a$) illustrates a modification to the transceiver of FIG. 1 in accordance with a first arrangement of a second embodiment of the invention.
Figure 4B:
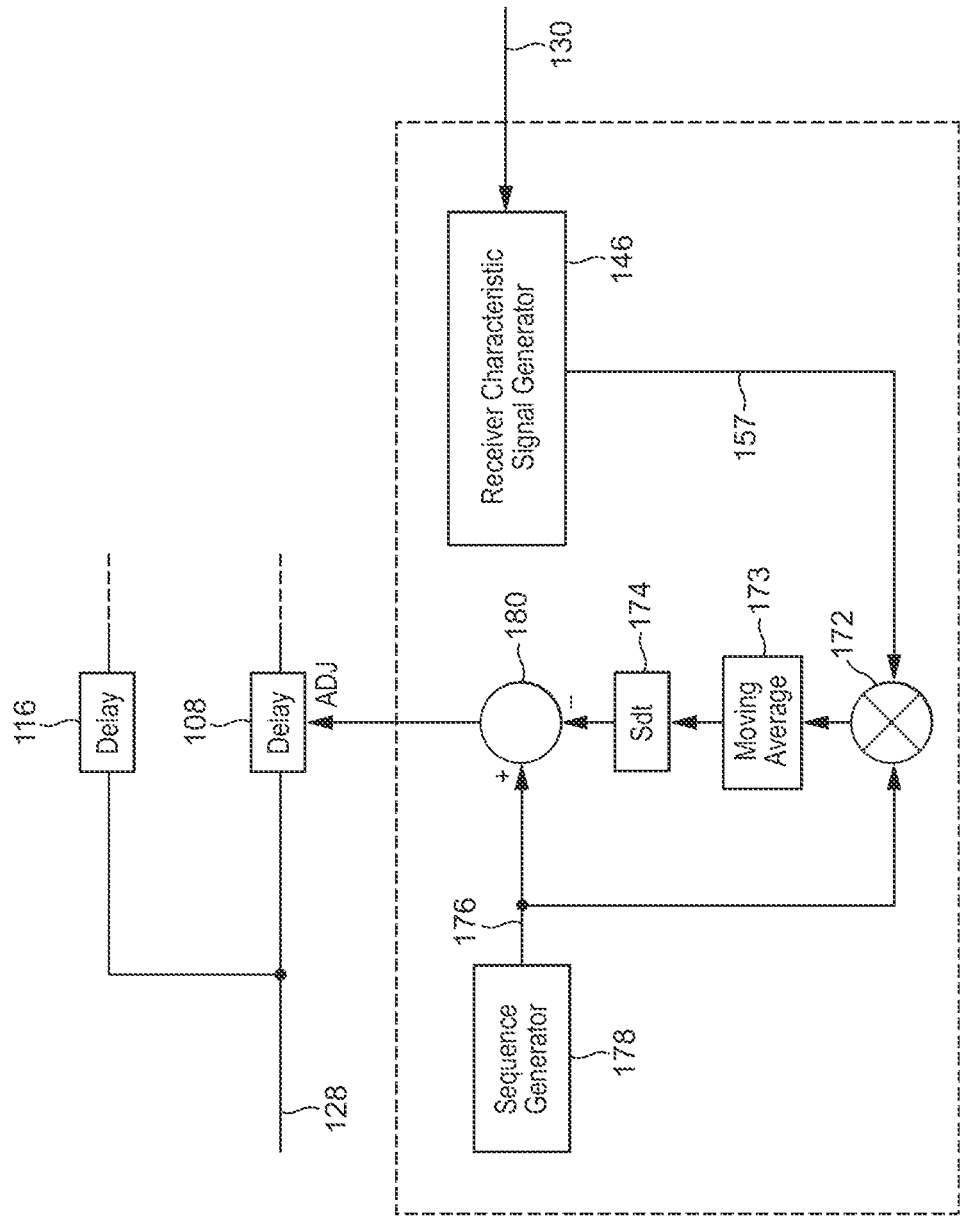

In accordance with a first and second arrangements of a second embodiment of the invention with reference to FIGS. 4(a) and 4(b), the transceiver 100 is again provided with the measurement and calibration block 136, corresponding to the measurement and calibration block 136 of FIG. 2, but adapted in accordance with the second embodiment and its exemplary implementations.

The second embodiment is directed to an exemplary technique for optimizing the transmitter in a normal phase of operation of the transmitter rather than in a calibration phase, i.e. when the receiver can be expected to receive and detect signals transmitted on an air interface, although the embodiment can still be used in a factory setting calibration operation.

In accordance with this second embodiment of the invention, in a calibration operation during normal operation of the transmitter 101, the transmitter 101 is configured to transmit and the receiver 103 is configured to receive.

In normal operation, the signal received for processing in the receiver processing circuitry contains the wanted received signal, interference from external sources, and leakage signal attributable to noise and distortion in the transmitter 101 as a result of the coupling between the transmitter and receiver.

In accordance with this second embodiment of the invention, a technique is provided to discern between the leakage signal and the other signals present in the receiver 103, so that the leakage signal can be used to control the delay in the transmitter 101.

A first arrangement in accordance with the second embodiment is now described with reference to FIG. 4(a).

The measurement and calibration block 136 receives as an input the received signal on line 130, and generates the adjustment signal ADJ on line 152. The receiver characteristic signal generator 146 is arranged to receive the signal on line 130 and generate a signal indicative of a characteristic of the signal detected in the receiver on line 157, which is delivered to a memory buffer 149. The receiver characteristic signal generator 147 may be a functional block of the receiver. The measurement and calibration block 136 additionally includes a sequence generator 178, an output of which on line 176 provides an input to a memory buffer 151. The outputs of the memory buffers 151 and 149 form respective inputs to a multiplier 172. The output of the multiplier 172 forms an input to an integrator 174. The output of the integrator forms one input to a subtractor 180, the other input to the subtractor 180 being provided by the output of the signal generator 178 on line 176.

The output of the subtractor 180 provides the adjustment signal ADJ on line 152.

In accordance with the described first arrangement of the second embodiment, the receiver characteristic signal generator is arranged to use any suitable functionality to provide a signal denoting a characteristic of the quality of service of the signal detected in the receiver. This may, for example, be an RSSI measurement block as in the first embodiment. This may, in more general terms, be a block for generating a signal giving some indication of the interference in the receiver.

In the first arrangement of the second embodiment, a calibration period is determined, which may correspond to a frame period of the transmitted signal. A sequence of adjustment values are generated, one set of adjustment values for each period. In successive periods, the predetermined adjustment values are generated by the sequence generator 178. As in the first embodiment described hereinabove, in an exemplary illustration of the second embodiment the adjustment values may correspond to delay values for the delay bock 108, and hence the adjustment signal ADJ is illustrated as forming an input to the delay block 108.

The generated sequence for each period is then delivered to the buffer memory 151.

For the purpose of description of the first arrangement of the second embodiment, in an exemplary arrangement the receiver characteristic signal generator generates a quality of service indicator of the signal detected in the receiver, which is delivered to the memory buffer 149.

The multiplier 172 multiplies the quality of service indicator for a current detected period with the generated sequence applied on line 176 for that period. The multiplier thus generates a value for each frame which represents a weighted quality of service indicator. This gives a measure of the performance of the receiver over each period. This signal is then processed to provide the optimum adjustment signal for the transmitter. This processing involves subtracting the weighted quality of service indicator from the generated sequence on line 180 using subtractor 180, and providing the result to the delay block 108 as the adjustment signal on line 152. Thus the output of the subtractor 174 effectively provides an indication in the error in the sequence on line 176.

In an exemplary implementation of the first arrangement of the second embodiment of FIG. 4(a), the memory buffer 149 and 151 are used to store the discrete values of the quality of service indicators and the generated sequence for multiple applications of the sequence over multiple frames. The samples may then be extracted from the memory buffers, and averaged to provide direct measurement of the receiver performance for each generated sequence value. The best value may then be directly chosen.

Figure 5:
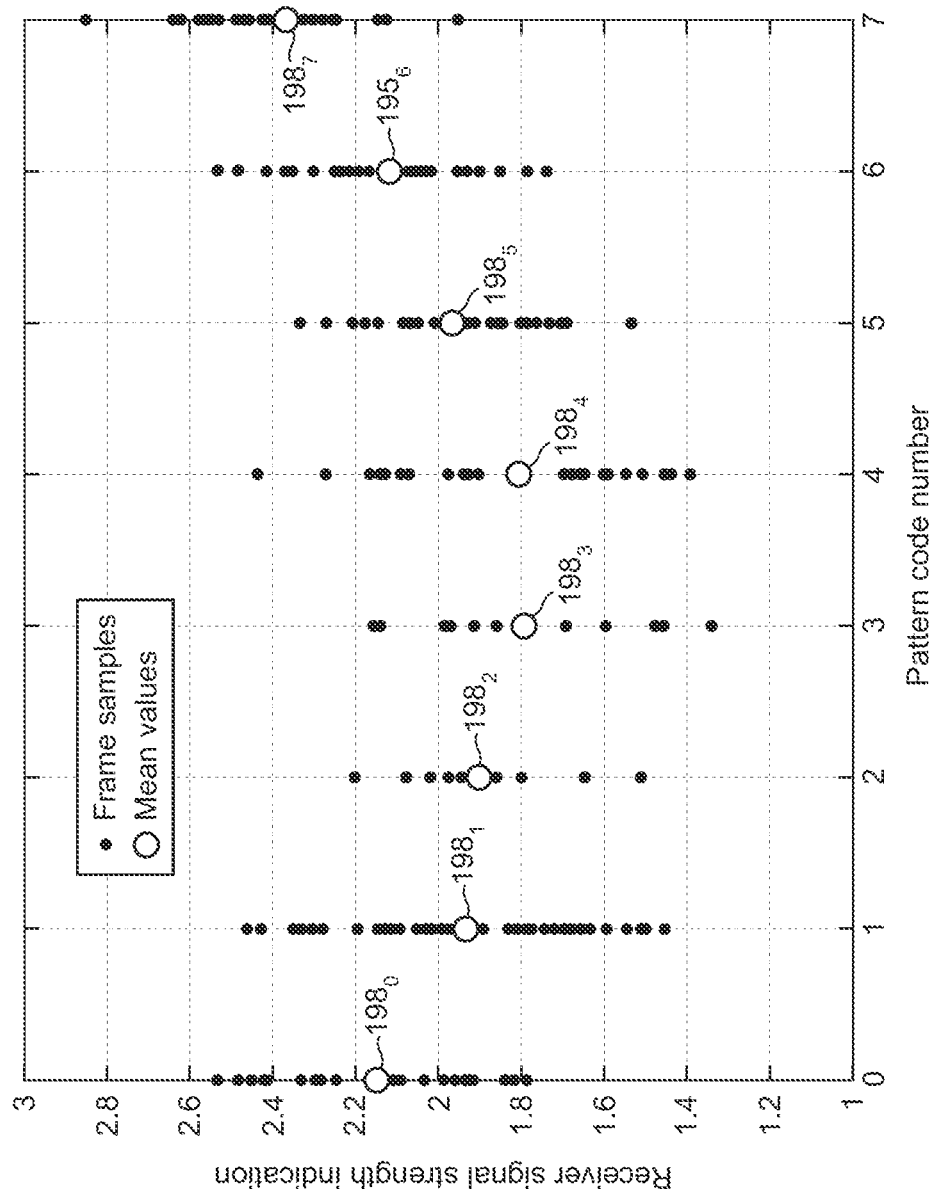
FIG. 5 illustrates a measured performance characteristics for generating an adjustment signal in a first exemplary arrangement of the second embodiment.

FIG. 5 illustrates the results measured in such an exemplary arrangement. For each pattern code number, multiple quality of service indicators (in this example RSSI values) are detected. The RSSI values, over a large number of samples, provide a spread for each pattern code number. An average value of each pattern code number can then be determined, as illustrated by circles $198_0$ to $198_7$ in FIG. 5. The average or mean value for each pattern code number is then used as a basis to determine the pattern code number having the lowest mean value. That pattern code number is then selected as the calibrated value, i.e. selected as the adjustment signal.

Figure 6:
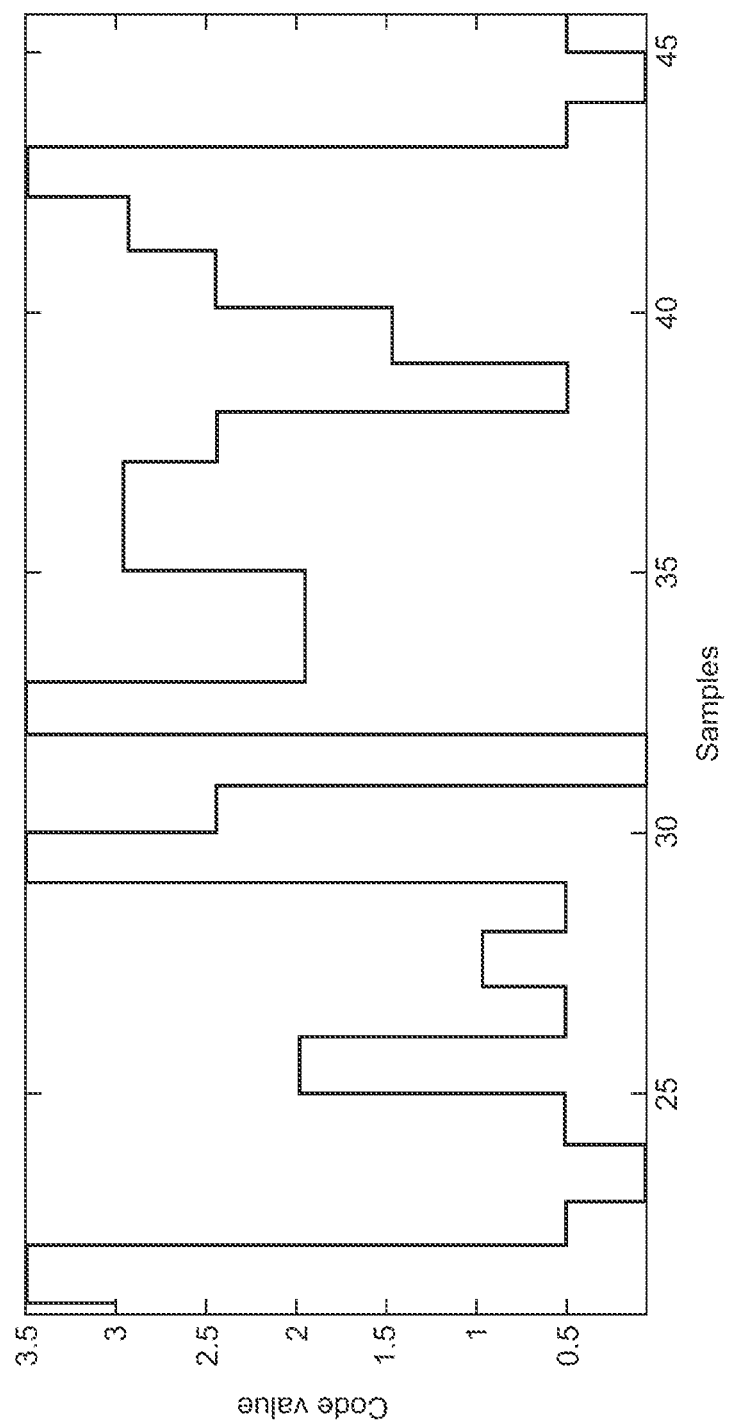
FIG. 6 illustrates a sequence of values generated in order to generate the measured values of FIG. 6 in the first exemplary arrangement of the second embodiment.

FIG. 6 illustrates an example pattern code sequence in an arrangement for generating the measurements of FIG. 5. As can be seen, the code value changes for each sample period)

e.g. frame), with code values recurring. The measured values for each sample are grouped according to the code value—or pattern—for that sample to generate the measurements of FIG. 5.

A second arrangement in accordance with the second embodiment is now described with reference to FIG. 4(b).

As in the first arrangement of the second embodiment, the measurement and calibration block 136 receives as an input the received signal on line 130, and generates the adjustment signal ADJ on line 152. The receiver characteristic signal generator 146 is arranged to receive the signal on line 130 and generate the signal indicative of a characteristic of the signal detected in the receiver on line 157, which is delivered directly as one input of the multiplier 172. The output of the sequence generator 178 on line 176 is delivered directly as the other input to the multiplier 172. The output of the multiplier 172 forms an input to a moving average buffer 173. The output of the moving average buffer provides an input to the integrator 174. The output of the integrator 174 again forms one input to the subtractor 180, the other input to the subtractor 180 being provided by the output of the signal generator 178 on line 176. The output of the subtractor 180 provides the adjustment signal ADJ on line 152.

In this second exemplary implementation of the second embodiment, the moving average buffer 173 is configured to maintain a rolling average period-by-period of the weighted sequence. The multiplier multiplies the generated sequence on line 176 by the measured quality of service indicator on line 157 to provide the weighted sequence to the moving average buffer 173. The output of the moving average buffer 174 is integrated by the integrator 174, and then applied to the subtractor 180 which operates in the same manner as with the arrangement of FIG. 4(a).

Figure 7:
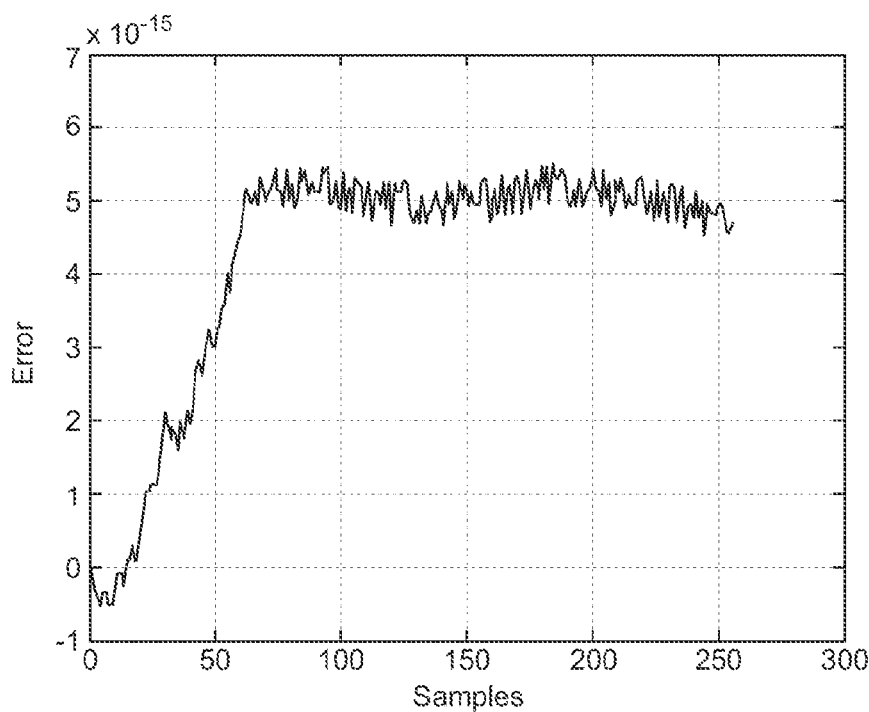
FIG. 7 illustrates an adjustment signal in a second exemplary arrangement of the second embodiment.

FIG. 7 illustrates a plot of the output of the moving average filter (buffer 173) of FIG. 4(b), on a period-by-period basis in an exemplary implementation with the connection to the subtractor 180 disconnected for illustrative purposes. The vertical axis illustrates the signal generated by the moving average filter, which represents the error signal to be delivered to the integrator 174, and the horizontal axis represents the detected samples. In the exemplary arrangement associated with the graph of FIG. 7, for each measurement period the quality of service indicator is multiplied by the value of the sequence (e.g. a two-state pseudo random sequence or an M-sequence), and the result averaged with a 64 tap moving average filter. For the first 64 samples the filter is settling, and there is only a small amount of noise detected plus any residual due to the sequence properties. After the settling period, the value settles at a positive level. The positive result implies the delay is too large: a negative result would imply the delay is too small. If the delay alignment is exactly correct, then there would be no mean signal output. The feedback signal generated at the output of the moving average filter, as shown in FIG. 5, may be used in a simple control loop as is well-known in the art.

In accordance with this second embodiment of the invention, the quality of service characteristic of the received signal is used as an indication of the amplitude of the leakage signal at the receiver 103. This signal has a significant, rapidly changing fluctuation due to multipath and interference levels in the air interface. Thus in a preferred implementation a technique is provided in order to integrate these fluctuations and provide a disturbance to correlate against.

The sequence generated by the sequence generator 178 of FIGS. 4(a) and 4(b) is preferably long enough to provide adequate resolution in the control of the delay to achieve the required delay matching.

In general, the invention provides a technique for adjusting the transmitted signal in order to reduce the distortion therein, by detecting a characteristic of a signal in the receiver without having to demodulate/decode the signal transmitted by the transmitter. In general this is achieved by determining a characteristic of a signal detected in the receiver, preferably a quality of service characteristic.

The quality of service indicator may comprise any one of a received signal strength indicator; a signal-to-noise plus interference ratio; or a quality of service parameter dependent upon a signal-to-noise plus interference ratio, such as Bit Error Ratio (BER) or Error Vector Magnitude (EVM).

In a factory setting calibration mode of operation, the signal detected in the receiver will comprise an interference signal including noise and distortion corresponding to distortion of the transmitted signal in the transmitter. In a normal mode of operation, the signal detected in the receiver will comprise a wanted receiver signal, as well as an interference signal including noise and distortion corresponding to distortion of the transmitted signal in the transmitter.

The invention seeks to minimize the distortion in the transmitted signal, by adjusting a setting in the transmitter and determining the effect that such adjustment has on a signal detected in the receiver. The invention does not involve determining an absolute value of a signal in the receiver resulting from distortion in the transmitted signal. The invention preferably involves determining the influence that varying a setting in the transmitter has in a measured quality of service characteristic in the signal detected in the receiver. A quality of service indicator in the receiver is adjusted by adjusting a setting in the transmitter. This quality of service indicator may be an indicator of noise detected in a signal in the receiver.

In normal operation of the transmitter, it is important to average out the results based on the signal detected in the receiver in order to isolate the influence due to distortion of the transmitted signal in the signal detected in the receiver.

This second embodiment of the invention preferably makes use of hardware already existing in the transceiver.

This second embodiment of the invention preferably requires simple slow time processing, and therefore consumes little power.

This second embodiment of the invention preferably uses a disturbance that allows transmission to remain within required spectral limits at all times, without degrading transmission quality.

This second embodiment can be applied during normal operation of the transceiver, allowing the tracking of temperature, ageing, channel frequency and any other mechanisms affecting the transmitter distortions.

Whilst this second embodiment may be used during normal operation of the transceiver, it may also be used in a factory calibration process as with the first embodiment.

The first and second embodiments as described hereinabove set out exemplary arrangements in which the adjustment signal is used to control the delay in the signal path to the RF amplifier. As noted above, the invention is not limited to such an arrangement, and the adjustment signal may generally be used to control a setting in the transmitter in order to reduce a characteristic of the signal detected in the receiver which is indicative of the distortion of the transmitted signal.

The settings in the transmitter which may be varied by the adjustment signal include, but are not limited to: the delay in the signal path; the delay in the envelope path; the values in the shaping table; the phase error pre-distortion; gain control errors in the modulator; gain controls in the main signal path; and settings in the vector modulator (e.g. IQ balances, nonlinearity; carrier leakage; and phase imbalance); dc offset; reconstruction filter bandwidth; and RF stage supply voltage.

The principle of operation in using the adjustment signal for adjusting the settings of other values/parameters in the transmitter are the same as for the delay optimisation described above.

For example, where the adjustment signal is used to adjust the settings of the shaping table, the general principle is that variables in the shaping table are adjusted that control transmitter distortion in order to optimise a noise characteristic of a signal detected in the receiver, such as a receiver RSSI or receiver quality of service indication. This has the benefit of directly optimising the transceiver performance as a system rather than optimising a goal that is solely related to the transmitter. For example flat AM-AM gain is typically an objective with the shaping table (iso-gain), but this may not produce the minimum distortion due to AM-PM effect. Likewise the best matched delay may not be the best delay for minimum received band noise because of the phasing of the AM-PM and AM-AM distortion components. Thus in an alternative arrangement of the first and second embodiments, the variables in the shaping table are adjusted to achieve the best possible receiver performance.

Figure 8:
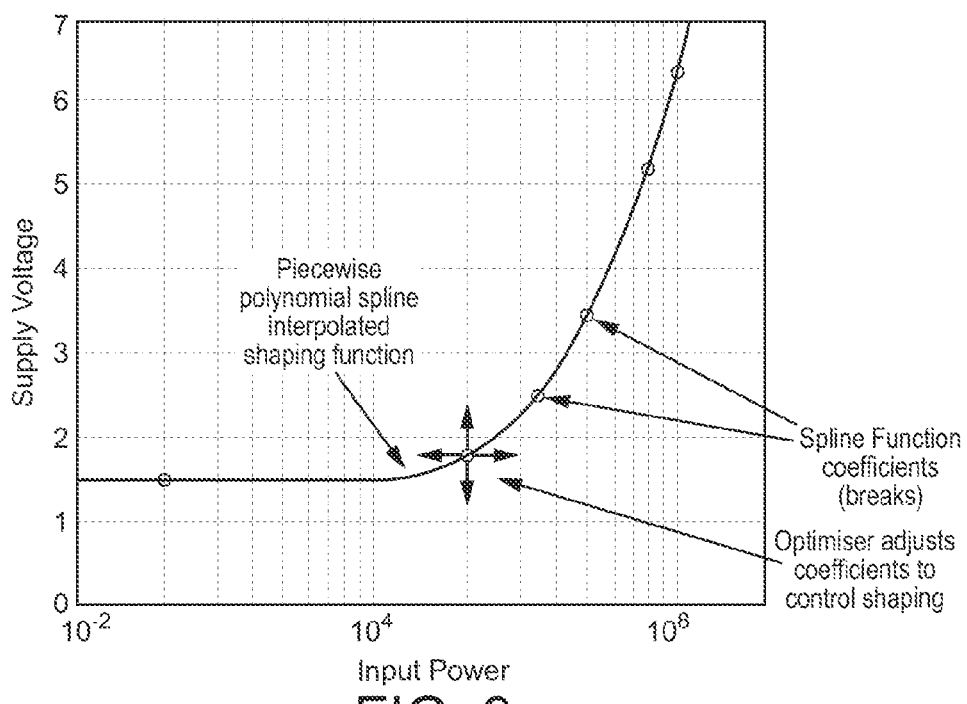
FIG. 8 illustrates a performance characteristic in an arrangement in which the values of a shaping table in the transmitter are adjusted.

In a preferred implementation the shaping is represented by a piecewise polynomial having breaks (or coefficients) that are adjusted by an optimiser. The endpoints are kept static so that there are only a small number of variables in the multi-variate optimisation. Optimisation techniques such as gradient optimisation may be used by the calibration and measurement block 136 to optimise, for example, the receiver SNR or RSSI and, for example to minimise the integrator output in FIG. 4. The optimiser goal would be minimum sensitivity to the variables which corresponds to optimum SNR performance. This is illustrated with reference to FIG. 8.

The invention, and the various embodiments described herein, addresses problems associated with self-interference of the receiver 103 from its own transmitter 101. The linearity that can be achieved with envelope tracking and without shaping controls, other than that based upon nominal power amplifier characterisation, is already adequate to meet adjacent channel, EVM and spurious emissions requirements.

The invention allows compensation for device variation to optimise receiver performance.

The invention has been described herein with respect to embodiment and arrangements configured to operate in a frequency division duplex (FDD) system in which the transmitter and receiver of the transceiver are configured to different frequencies. The invention and its embodiments may also be implemented in a time division duplex (TDD) system, by tuning the receiver away from the normal system (transmit) frequency during a calibration phase of operation.

The invention has been described herein by way of reference with example to various preferred embodiments, in the context of a transmitter employing envelope tracking and in the context of features of a mobile communications system. One skilled in the art will appreciate that the invention is not limited to these specifics, and the scope of protection is defined by the appended claims.

The invention claimed is:

1. A method of envelope tracking by an envelope tracking transceiver, the envelope tracking transceiver including a transmitter including an envelope tracking amplification stage arranged to receive an input signal to be amplified and a power supply voltage tracking the envelope of the input signal to be amplified, and a receiver being located with the transmitter and for receiving a received signal, the method comprising:

generating an amplified signal for transmission at the output of the amplifier;
tuning the receiver to a frequency to reject the intended transmit signal of the transmitter;
generating a sequence of adjustment values during one or more periods;
generating a signal indicative of a characteristic of the received signal;
multiplying the signal indicative of the characteristic of the received signal and the generated sequence of adjustment values for each of the periods;
generating an adjustment signal based on the multiplication;
and
adjusting a setting of the transmitter in dependence on the adjustment signal.

2. The method of claim 1, wherein generating the signal indicative of the characteristic of the received signal comprises generating a quality of service indicator for the received signal, and adjusting the setting of the transmitter comprises adjusting said setting in order to improve the generated quality of service indicator.

3. The method of claim 2, wherein generating the quality of service indicator comprises generating at least one of a received signal strength indicator, a signal-to-noise plus interference ratio, or a quality of service parameter dependent upon a signal-to-noise plus interference ratio.

4. The method of claim 2, further comprising:
storing discrete values of the quality of service indicator and the generated sequence of adjusted values in at least one memory.

5. The method of claim wherein adjusting the setting in the transmitter comprises adjusting one or more of a delay in a main signal path, or a delay in the magnitude signal path.

6. The method of claim wherein the transmitter further includes a shaping function block for generating a supply voltage in dependence on the magnitude of the signal to be amplified, and wherein adjusting the setting of the transmitter comprises adjusting a setting of the shaping function block.

7. The method of claim 1, wherein generating the adjustment signal based on the multiplication comprises:
subtracting a weighted quality of service indicator from the generated sequence for a respective period.

8. The method of claim 1, wherein generating the adjustment signal based on the multiplication comprises:
maintaining a moving average of the weighted quality of service indicator; and
subtracting the moving average from the generated sequence for a respective period.

9. A transceiver comprising:
an envelope tracking transmitter including an envelope tracking amplification stage arranged to receive an input signal to be amplified and a power supply voltage tracking the envelope of the input signal to be amplified, wherein the envelope tracking transmitter is configured to generate an amplified signal for transmission at an output of the amplification stage; and
a receiver adapted to reject an intended transmit signal of the transmitter, wherein the receiver comprises:
a sequence generator adapted to generator a sequence of adjustment values during one or more periods;
a receiver characteristic signal generator adapted to generate a signal indicative of a characteristic of a received signal in the receiver;

a multiplier adapted to multiply the signal indicative of the characteristic of the received signal and the generated sequence of adjustment values for each of the periods;

a subtractor adapted to generate an adjustment signal based on the multiplication; and a controller adapted to for adjust a setting of the transmitter in dependence on the adjustment signal.

10. The transceiver of claim 9, wherein the controller is adapted to adjust the setting of the transmitter in order to reduce the distortion in a transmitted signal.

11. The transceiver of claim 9, wherein the receiver characteristic signal generator is adapted to generate a quality of service indicator for the received signal in the receiver, and the controller is adapted to adjust the setting of the transmitter in order to improve the quality of service indicator.

12. The transceiver of claim 11, wherein the receiver characteristic signal generator is adapted to generate the quality of service indicator by generating one of a received signal strength indicator, a signal-to-noise plus interference ratio, or a quality of service parameter dependent upon a signal-to-noise plus interference ratio.

13. The transceiver of claim 11, further comprising:
at least one buffer adapted to store discrete values of the quality of service indicator and the generated sequence of adjusted values.

14. The transceiver of claim 9, wherein the controller is adapted to adjust the setting of the transmitter by adjusting one or more of a delay in a main signal path or a delay in a magnitude signal path.

15. The transceiver of claim 9, wherein the transmitter includes a shaping function block for generating a supply voltage in dependence on the magnitude of the input signal to be amplified, the controller being adapted to adjust the setting of the transmitter by adjusting a setting of the shaping function block.

16. The transceiver of claim 9, wherein the amplification stage comprises a radio frequency (RF) amplifier, and the input path is an RF signal path.

17. The transceiver of claim 9, wherein the subtractor is adapted to generate the adjustment signal based on the multiplication by subtracting a weighted quality of service indicator from the generated sequence for a respective period.

18. The transceiver of claim 9, wherein the subtractor is configured to generate the adjustment signal based on the multiplication by:
maintaining a moving average of the weighted quality of service indicator; and
subtracting the moving average from the generated sequence for a respective period.

* * * * *